United States Patent
Ouellet et al.

[11] Patent Number: 6,074,946
[45] Date of Patent: Jun. 13, 2000

[54] INTEGRATED PROCESSING FOR AN ETCH MODULE USING A HARD MASK TECHNIQUE

[75] Inventors: Luc Ouellet, Granby; Abdellah Azelmad, Bromont, both of Canada

[73] Assignee: Mitel Corporation, Kanata, Canada

[21] Appl. No.: 08/794,441

[22] Filed: Feb. 4, 1997

[30] Foreign Application Priority Data

Dec. 24, 1996 [CA] Canada .................................. 2193905

[51] Int. Cl.[7] .................................................. H01L 21/44
[52] U.S. Cl. ........................... 438/689; 438/942; 216/41; 216/51
[58] Field of Search ........................ 216/41, 51; 438/689, 438/942

[56] References Cited

U.S. PATENT DOCUMENTS 5,369,053  11/1994  Fang ........................................ 437/194

FOREIGN PATENT DOCUMENTS 0 113 983   7/1984   European Pat. Off. .
0 726 597   8/1996   European Pat. Off. .
96 27899    9/1996   WIPO .

OTHER PUBLICATIONS

Patent Abstracts of Japan vol. 018. No. 141 (E–1520), Mar. 9, 1994 & JP 05 326719 A (OKI Electric Ind. Co Ltd) Dec. 10, 1993 * Abstract * Claim 1–5, 8–11 & JP 05 326719 A (OKI Electric Ind. Co. Ltd.) Dec. 10, 1993 * Figures *.

Patent Abstracts of Japan vol. 008, No. 190 (E–263), Aug. 31, 1984 & JP 59 078585 A (Hitachi Seisakusho KK) May 7, 1984 col. 3, line 11—col. 4, line 25; Figures 1 & 2.

*Primary Examiner*—Robert Kunemund
*Attorney, Agent, or Firm*—Marks & Clerk

[57] ABSTRACT

A method of fabricating a semiconductor device includes etching holes through at least one deposited layer to an underlying structure. A hard mask is deposited on an upper surface of a device to be etched, the mask is patterned with the aid of a photoresist, and holes are etched in the hard mask. After removal of the photoresist, contact or via holes are etched through the patterned hard mask in the deposited layer(s) to reach the underlying structure.

14 Claims, 3 Drawing Sheets

INTEGRATED PROCESSING FOR AN ETCH MODULE USING A HARD MASK TECHNIQUE

FIELD OF THE INVENTION

This invention relates to a method of fabricating a semiconductor device which includes etching holes through at least one deposited layer to an underlying structure.

BACKGROUND OF THE INVENTION

Typically in the interconnection of semiconductor devices, a first layer of insulating dielectric is deposited over previously deposited and/or patterned polysilicon polycide or refractory metal transistor gates, sources, and drains, as well as over previously deposited and patterned capacitor electrodes. Contact holes are dry etched in the insulating dielectric to reach transistor gates, sources and drains as well as capacitor electrodes and any other electrodes that need to be connected to other devices.

A first level of interconnect material is deposited so as to electrically contact transistor gates, sources and drains as well as capacitor electrodes. This first level of interconnect material is dry etched, typically in various chlorine and fluorine containing discharges, using standard photolithography techniques to form interconnect tracks. A second layer of insulating dielectric is deposited over the patterned interconnect material to ensure its electrical isolation. Via holes are dry etched in that insulating dielectric to reach the tracks of the first level of interconnect material. A second level of interconnect material is deposited. The second level of interconnect material is dry etched in a manner similar to the first level. The above steps are repeated many times if more than two levels of interconnect material are needed. Finally a top protective layer is deposited.

The second step of the above sequence, called contact hole dry etching, requires the patterning of small diameter contact holes, in the order of 1.0 µm of diameter, in the insulating dielectric. These contact holes electrically connect the first level interconnect material to transistor polysilicon or silicide gates, to substrate or silicide sources and drains as well as to polysilicon or silicide capacitor electrodes and any other electrodes that need to be connected to other devices.

The sixth step of the above sequence, called via hole dry etching, necessitates the patterning of similarly small diameter via holes, in the order of 1.0 µm of diameter, in the insulating dielectric. These via holes electrically connect the second level interconnect material to first level interconnects.

The insulating dielectric is also dry etched in the scribe lines at each one of these two steps. These scribe lines are large areas, in the order 100.0 µm of width, that are used to permit a diamond saw to physically cut the substrate and form many individual dies from a wafer. Scribe line etching is performed down to the substrate at the second, fourth, sixth and eighth steps.

The point in time when the substrate is reached in the scribe lines is called the end-point. The excess time added to the end-point is called the over-etch time and is used in order to ensure etch completion everywhere on the wafer. This over-etch time must be minimized during contact hole etching because a catastrophic over-consumption of substrate or silicide sources and drain regions can occur because the substrate-to-dielectric or silicide-to-dielectric etch selectivity is not infinite. This catastrophic over-consumption of substrate or silicide regions results in junction leakage and defective devices.

To avoid this catastrophic over-consumption, an automatic etch end-point is used. This automatic end-point is triggered when substantial part of scribe-lines becomes exposed. The sensitivity of most end-point detectors is not capable of detecting the exposure of contact and via holes.

Contact and via hole patterning requires many steps:

a) A positive or negative photoresist solution is spun over the dielectric material to be patterned in order to obtain the desired thickness.

b) The positive or negative photoresist is soft-baked to low temperatures, typically around 110° C. for about 6 minutes in order to evaporate solvents and water.

c) The obtained photoactive positive or negative photoresist film is locally exposed by using photomasks and step-and-repeat or projection alignment equipment. This results in local photo-induced chemical reaction in the positive or negative photoresist film.

d) A developer solution is used to locally remove the areas of the positive photoresist at which photo-induced chemical reactions occurred. The developer solution is used to remove unexposed regions of negative photoresist. The mask pattern is then transferred to the positive photoresist while its reverse image is transferred when negative photoresist is used.

e) The positive or negative photoresist is hard-baked to about 120° C. for about 6 minutes in order to stabilized the obtained pattern and make it suitable for underlying dielectric film dry patterning.

f) The wafer is transferred to a dry etcher. Most dry etchers use glow discharge in various configurations in order to ionize gas mixtures and provoke reactive sputtering and/or formation of volatile gases from the dielectric material to be patterned. Photoresist is used as local mask that prevents etching of underlayer dielectric material, thus transferring the photoresist pattern to the dielectric film.

As an example, typical gas mixtures for dry etching silicon dioxide based dielectric materials include:

An etch gas such as $SF_6$, $CF_4$, $C_2F_6$, or another fluorine-containing gas that can form volatile silicon-fluorine compounds, A catalyst gas such as $O_2$, or He that increases the etch rate by increasing the formation of atomic fluorine from the etch gas.

A passivation gas such as $CHF_3$, or another hydrocarbon, that permits passivation of the sidewalls and gives some anisotropy. This third type of gas is not necessary if the substrate temperature is maintained very low in order to create an artificial anisotropy by reducing the desorption rate of volatile etch by-products from vertical surfaces while ion bombardment on horizontal surfaces keeps the local etch rate high.

The dry-etch is terminated after a certain over-etch time is added to end-point. The scribe lines are etched-down to the substrate while, in case of the second step, the contact holes are etched down to the transistor polysilicon or silicide gates, to substrate or silicide sources and drains as well as to capacitor electrodes and any other electrodes that need to be connected to other devices. In case of the sixth step, the via holes are etched down to the first level interconnect patterns.

g) The wafer is transferred to a dry photoresist stripper where the remaining photoresist is removed.

h) The exposure of the photoresist to dry etch chemistries, at step f), very often causes dry stripping problems, at step g). For this reason a wet photoresist stripper solution is normally used after step g) to prevent photoresist residues. The wafer is then ready for interconnect material deposition.

Photoresist is a quasi-inorganic material containing carbon, hydrogen, oxygen, nitrogen, silicon and sulphur atoms, among others, that are bonded in such a way as to obtain desirable optical, chemical, physical, as well as mechanical properties. The exposure of this material to different plasma chemistries can cause anomalies within the plasma that can affect global as well as microscopic scale etch characteristics of the dielectric to pattern. The etch rate of the dielectric to be patterned, the etch selectivity of the dielectric and the material present at the bottom of the contacts or via holes, the etch uniformity of the dielectric to be patterned, and the loading effect of the resist during dielectric etch are four of the most important etch characteristics.

A dielectric etch module must be, as far as possible, independent of upstream and downstream process modules and should be, as far as possible, unaffected by variations of these upstream and downstream process modules.

As an example, the etch rate of the dielectric to pattern should be solely a function of the material to pattern and of the etch chemistry.

For a given material, dielectric etch module optimization should be possible by varying the etch parameters according to experimental techniques such as TAGUCHI orthogonal matrices. The parameters of this dielectric etch module to vary can be: power density, total pressure, gas residence time, gas ratios, plasma impedance and ion bombardment, gas type, wafer temperature, etc.

The independence of this dielectric etch module is possible if, and only if, the photoresist pattern module plays a minor role in the optimization of the dielectric etch module. If this is not the case, small fluctuations in the photoresist pattern module may cause major stability effects in the dielectric etch module and out-of-control situations.

As an example of the non-independence of process modules, it will be apparent that the patterned photoresist can be easily attacked by the plasma and can produce large amounts of by-product, such as oxygen atoms that can be used as catalyst, in some conditions, the etch of some dielectrics by more efficiently forming fluorine atoms from fluorine-containing compound etchant, and fluorine compound volatile, from the dielectric to pattern, then:

The etch rate of the dielectric will be strongly affected by the surface coverage ratio by the photoresist. This means that the same etch recipe will have different etch rates on different photoresist patterns. As a consequence, smaller devices, associated with a larger total surface of scribe lines not covered by photoresist, will see their dielectric etch rate reduced while the dielectrics of larger devices will etch faster; an effect called the macro-loading effect.

The etch rate of the dielectric, within a mean-free-path distance from a photoresist edge, will not be the same as the equivalent etch rate, far from photoresist areas. Since the mean-free-path, in most gases, is about 1.0 to 3.0 $\mu$m at a total pressure of about 5.0 Torr, then the etch rate of small diameter and isolated contact holes in the dielectric will be faster than the equivalent etch rate in scribe lines. The end-point signal will then be ineffective since the scribe lines will begin to clear well after the bottom of contact holes is reached. This may result in catastrophic substrate, polysilicon or silicide over-consumption and in associated junction or capacitor leakage. This effect is also called the micro-loading effect.

The dielectric overall etch rate uniformity and reproducibility will become a steep function of the photoresist baking uniformity and reproducibility.

Any attempt to optimize the dielectric etch module by modifying the etch recipe itself will give very limited effect since the photoresist by-products have a dominant role.

Any search for an improved and capable equipment for the dielectric etch module will probably give disappointing results.

SUMMARY OF THE INVENTION

According to the present invention there is provided a method of fabricating a semiconductor device which includes etching holes through at least one deposited layer to an underlying structure, comprising the steps of depositing on said at least one deposited layer a hard mask which is inert to chemicals used to etch said at least one deposited layer, patterning said hard mask with photoresist, etching holes in said patterned hard mask, removing said photoresist, and subsequently etching holes in said at least one deposited layer through the holes in said hard mask.

By using a so-called "hard mask" it is possible to verify if the photoresist material causes such a non-independence of the process modules. A "hard mask" is used as a replacement for the photoresist, and unlike the photoresist, should be inert and should not erode during the subsequent etch phase of the material that is being masked. In the case of an aluminum etch, it can, for example, be made of silicon oxide, silicon nitride, silicon oxynitride or other common dielectrics used in typical semiconductor processes. In the case of a silicon oxide etch, it can be Al, an Al alloy, TiN or combinations of Al and Ti materials.

The observation of the dielectric etch rates, with and without the use of hard mask, indicates how much the photoresist pattern module and the dielectric etch module are inter-linked.

The observation of dielectric etch rates using various photoresist patterns that have quite different photoresist surface ratios also indicates how important is the macro-loading effect. The micro-loading effect is important if the macro-loading effect is large and if the operating pressure is large enough to obtain a mean-free-path in the order of magnitude of the patterns to etch.

The invention also provides as a method of a method of fabricating a semiconductor wafer, comprising the steps of a) depositing a mask of hard material, which is inert to etch chemicals used in step f, over an underlying layer to pattern; b) depositing a photoresist layer over said mask; c) baking the photoresist; d) locally exposing the photoresist to form a desired pattern of regions on said mask; e) locally removing said regions of the photoresist; d) etching away the hard material in said regions; e) removing said photoresist layer; and f) subsequently etching holes in the underlying layer through said openings in said mask.

The invention will now be described in more detail, by way of example, only with reference to the accompanying drawings, in which.

An experiment was performed to confirm the non-independence of the photoresist pattern and dielectric etch modules. This experiment used three different splits in order to perform field oxide etching: a standard photoresist mask, a hard aluminum alloy mask, and blanket deposition with no mask. Field oxide was chosen because of its excellent uniformity and wafer-to-wafer reproducibility.

The split #1 of this experiment used silicon wafers on which 0.90 μm of field oxide was grown. The field oxide was coated with 1.65 μm of Hunt Chemical HIPR-6512 photoresist, soft baked at 110° C. for six minutes, and exposed using either one of the two following patterns:

pattern #1: The contact hole mask, M-60, of a device called C121 MAC that includes 2.0 μm diameter contacts, 125 μm×125 μm contact pads and 100.0 μm wide scribe lines.

pattern #2: A pattern consisting of sixty-three openings of 5000 μm×5000 μm, distributed on the surface of the wafer.

A hard bake at 120° C. for six minutes was performed to obtain wafers that were ready for the dielectric etch module.

The split #2 of this experiment used silicon wafers on which 0.90 μm of field oxide was grown. The field oxide was covered with a thin (typically about 200 nm) Al-1.0wt % Si-0.5wt % Cu aluminum alloy film. This aluminum alloy film was coated with 1.80 μm of Hunt Chemical HIPR-6517GH dyed photoresist, soft baked at 110° C. for six minutes, and exposed using either one of the two previously mentioned patterns. A hard bake at 120° C. for six minutes was performed before etching the underlying aluminum alloy. The photoresist was dry stripped in oxygen in a barrel asher leaving an aluminum alloy pattern than was used as hard mask for dielectric etch.

The split #3 of this experiment used silicon wafers over which 0.90 μm of field oxide was grown. These wafers were not covered by a mask and were used as reference wafers in order to find the etch characteristics without any mask.

These wafers were etched in a standard dielectric etch module that used the standard main etch gas mixture: $C_2F_6$, the etch gas; $O_2$ and He, the etch catalyst gas mixture; and no $CHF_3$, the passivation gas.

Figure 1:
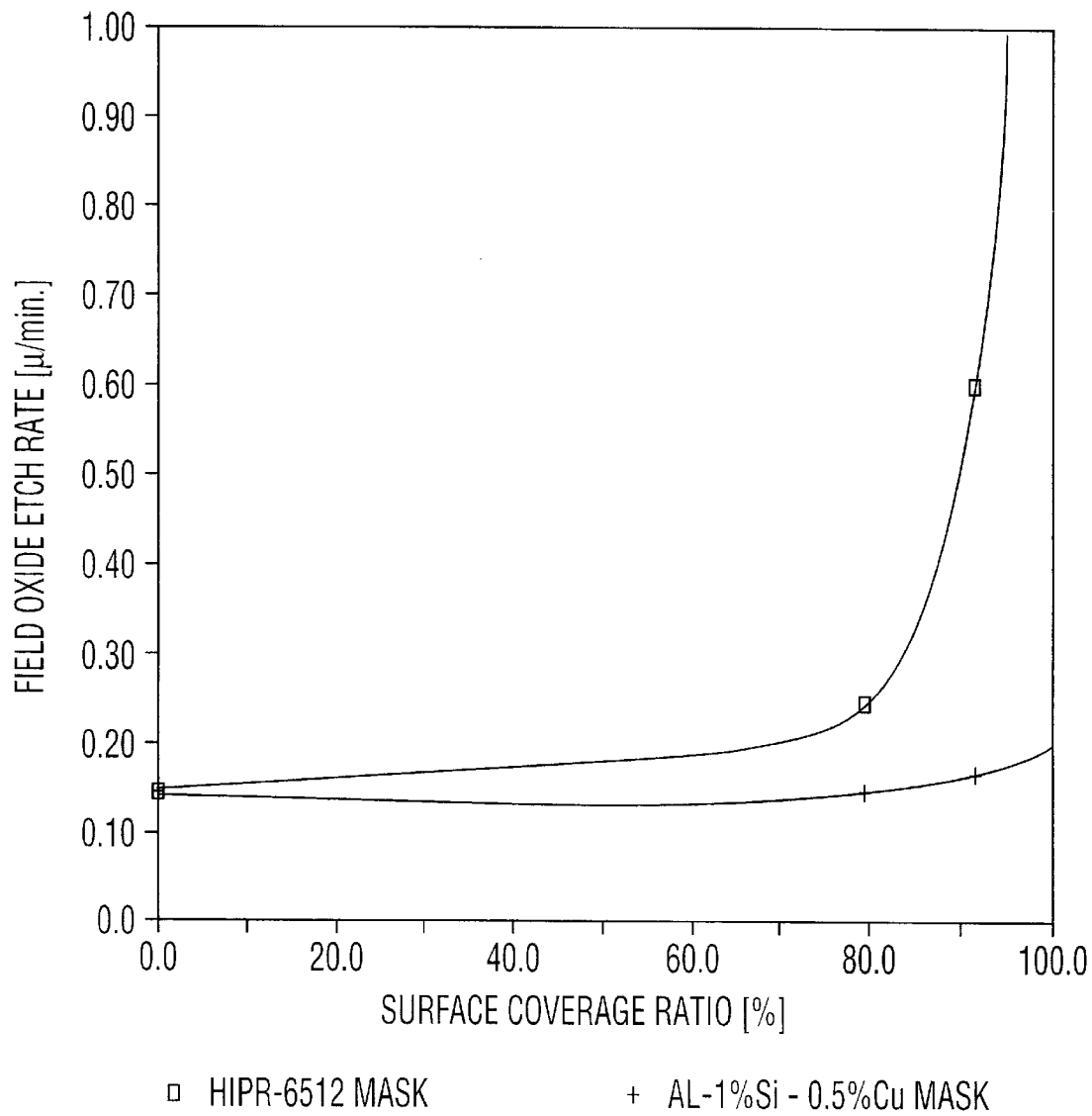
FIG. 1 is a graph showing the loading effect for a dielectric etch module.

The obtained etch rates [nm/min] and uniformities [+3σ nm/min.] are presented in the following table for two wafers per split per pattern:

by the Hunt Chemicals HIPR-6512 photoresist mask: since pattern #1 has a photoresist surface coverage ratio of 91.8% and an etch rate for the two wafers of 590+25 and 584+112 nm/min respectively, since pattern #2 has a photoresist surface coverage ratio of 79.6% and an etch rate for the two wafers of 242+26 and 239+28 nm/min respectively, and since pattern #3 has a photoresist surface coverage ratio of 0% and an etch rate for the two wafers of 146+15 and 147+12 nm/min respectively, it is possible to draw the loading effect curve shown in FIG. 1.

This graph shows that, for surface coverage ratios larger than 90.0%, the dielectric etch rate through the standard HIPR-6512 photoresist mask is a very steep function of the surface coverage ratio. The values indicate that the photoresist loading effect causes an average dielectric etch rate increase of more than 300% when the surface coverage ratio reaches about 91.8%. The extrapolation of the loading effect curve shows that even larger etch rate increases are projected for larger that 91.8% surface coverage ratios.

The graph also shows that, for surface coverage ratios larger than 90.0%, the dielectric etch rate through a hard Al/Si/Cu mask is a much smaller function of the surface coverage ratio. The values indicate that the hard mask loading effect reduces the average dielectric etch rate increase to less than 12% when the surface coverage ratio reaches about 91.8%. Since the dielectric etch rate through the hard mask, at 91.8% surface coverage ratio, is not exactly identical to the etch rate without any mask, a slight loading effect remains with the hard mask approach. This loading effect is believed to be due to a gas phase loading effect which could be even more reduced by working at lower pressures and smaller residence times (larger total flow rate) in order to more efficiently remove reaction by-products from the surface and replace them by fresh reactants. The extrapolation of the hard mask loading effect curve shows that very reasonable etch rate increases are projected for larger than 91.8% surface coverage ratios.

The contact patterning mask of advanced devices typically has a surface coverage ratio exceeding 95%, with most of the uncovered surface being occupied by contact pads and scribe lines. The number of such scribe lines drops when fewer number of larger dies can be patterned per wafer. This results in an increase of the surface coverage ratio with die dimensions.

| SPLIT #1 (PHOTORESIST MASK) | | SPLIT #2 (HARD MASK) | | SPLIT #3 (BLANKET) |
|---|---|---|---|---|
| PATTERN #1 | PATTERN #2 | PATTERN #1 | PATTERN #2 | NO PATTERN |
| 590 ± 25 | 242 ± 26 | 164 ± 17 | 143 ± 12 | 146 ± 15 |
| 584 ± 112 | 239 ± 28 | 164 ± 18 | 142 ± 10 | 147 ± 12 |

By comparing the pairs of wafers for each pattern within any split it can be seen that the results are reliable and that comparison between the splits and patterns pairs is possible.

By comparing the blanket split #3 with any pattern of standard split #1, it is will be observed that the Hunt Chemicals HIPR-6512 photoresist increases the dielectric local etch rate by up to 300% and, since these etch rates are measured in large area scribe lines, possibly by even larger values if this dielectric is patterned by small openings such as contact or via holes.

It is possible to estimate the field oxide etch loading effect by plotting the field oxide etch rate versus surface coverage

EXAMPLES

A contact mask of a typical (178 mils×175 mils) device, called C121 MAC, was patterned on a 77.3 cm² area (4"φ) wafer. 1.94 cm² of the surface of the wafer was occupied by contacts, 1.67 cm² by contact pads, and 2.72 cm² by scribe lines. The surface coverage of the resist, in that case, was 91.8% and 30.6% of the openings. 2.51% of the wafer surface, was occupied by contacts. The undesirable dielectric etch rate increase was measured to be 302% with the photoresist mask and only 11.9% with the aluminum hard mask.

A contact mask of a larger (207 mils×305 mils) device, called C146C TPHONE, was patterned on the same area wafer. 1.63 cm² of the surface of the wafer was occupied by contacts, 0.80 cm² by contact pads, and 1.52 cm² by scribe lines. The surface coverage of the resist was increased to 96.05% while 41.3% of the openings, or 2.11% of the wafer surface, was now occupied by contacts. The undesirable dielectric etch rate increase was found to be about 500% with the photoresist mask and only 20% with the aluminum hard mask.

A contact mask of an even larger (355 mils×304 mils) device, called C117P DSLIC, was patterned on the same area wafer. 0.96 cm² of the surface of the wafer was occupied by contacts, 0.33 cm² by contact pads, and 1.26 cm² by scribe lines. The surface coverage of the resist was then increased to 96.70% while 37.6% of the openings, or 1.24% of the wafer surface, was occupied by contacts. The undesirable dielectric etch rate increase was found to exceed 700% with the photoresist mask and only 22% with the aluminum hard mask.

Even larger die sizes, in the order of 400 mils×400 mils or more, are needed for some advanced applications.

Increasing the surface coverage ratio causes the HIPR-6512 photoresist loading effect to increase even more while the hard mask approach keeps the loading effect to a negligible level.

Figure 2A:
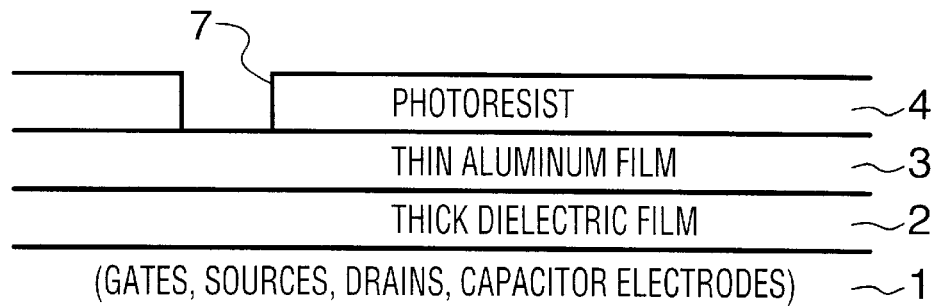
FIGS. 2a and 2b show one step in a process for making contact and via holes respectively.
Figure 3A:
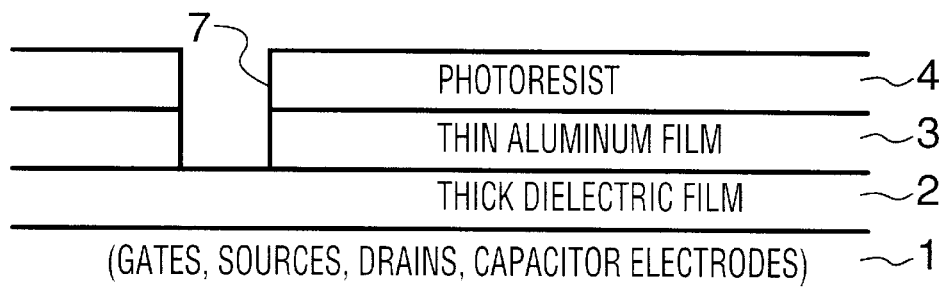
FIGS. 3a and 3b show another step in a process for making contact and via holes respectively.
Figure 4A:
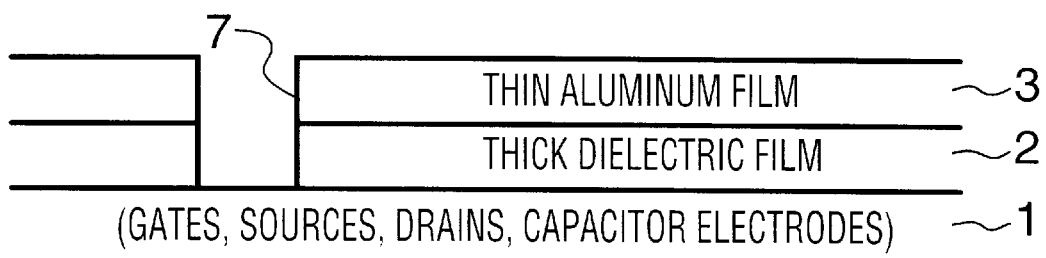
FIGS. 4a and 4b show a still further step in a process for making contact and via holes respectively.

In accordance with one embodiment according to the invention, as shown in FIGS. 2a, 3a, and 4a, contact holes 7 are formed by depositing a thin layer of pure aluminum or aluminum alloy 3 over a dielectric to pattern 2. The thickness of this layer 3 is minimized in order to improve the pattern transfer accuracy. The layer 3 typically has a thickness of about 200 nm . The dielectric layer 2 is located on a substrate 1 containing active components of the semiconductor device.

A positive or negative photoresist solution 4, which may or may not be dyed is spun over the aluminum or aluminum alloy layer 3 to be patterned. The thickness of this photoresist layer can be small since the thickness of the layer to pattern is also small. This results in better pattern transfer.

The positive or negative photoresist is soft-baked to low temperatures, typically around 110° C. for about 6 minutes in order to evaporate solvents and water.

The obtained photoactive positive or negative photoresist film 4 is locally exposed by using photomasks and step-and-repeat or projection alignment equipment. This results in local photo-induced chemical reactions in the positive or negative photoresist film located over the aluminum or aluminum alloy film.

A developer solution is used to locally remove the areas 7 of the positive photoresist at which photo-induced chemical reactions occurred. The developer solution is used to remove unexposed regions of negative photoresist. The mask pattern is then transferred to the positive photoresist while its reverse image is transferred when negative photoresist is used.

The positive or negative photoresist is hard-baked to about 120° C. for about 6 minutes in order to stabilize the obtained pattern and make it suitable for underlying dielectric film dry patterning.

The wafer is transferred to an aluminum or aluminum alloy etcher. This etcher may etch the aluminum or aluminum alloy with wet chemicals or may use dry etch chemistries. If a wet etch approach is chosen, a critical dimension loss of about two times the thickness of the aluminum layer results. A dry etch approach results in minimal dimension loss. The photoresist pattern is then transferred to the aluminum or aluminum alloy film:

The wafer is transferred to a photoresist stripper where the photoresist is removed to leave hole 7 (FIG. 3a). The removal of the photoresist is known to be very easy at that step and no resist residue results.

The wafers are transferred to a dielectric dry-etcher to form contact hole 7 (FIG. 4a). The etch is stopped after a certain over-etch time is added to end-point. The end-point is more precise because of the reduced loading effect. The scribe lines are etched down to the substrate while the contact holes are etched-down to the transistor polysilicon or silicide gates, to substrate or silicide sources and drains as well as to capacitor electrodes and any other electrodes that need to be connected to other devices.

Figure 2B:
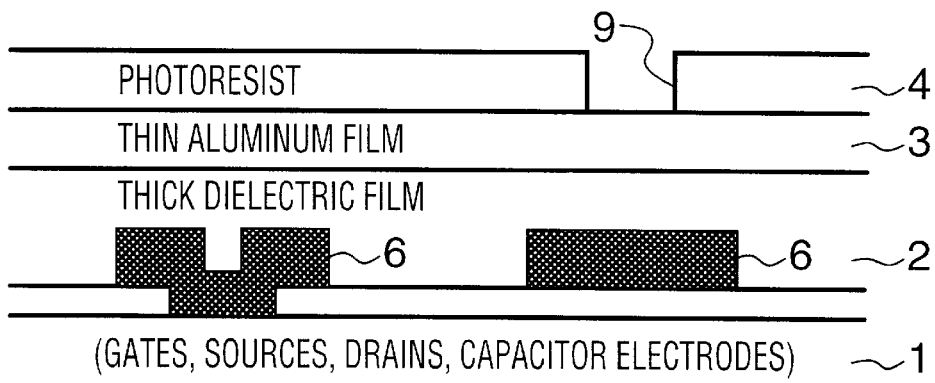
Figure 3B:
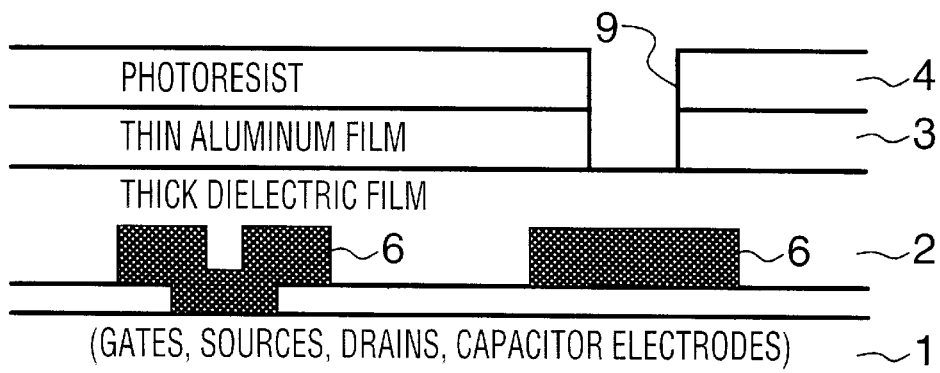
Figure 4B:
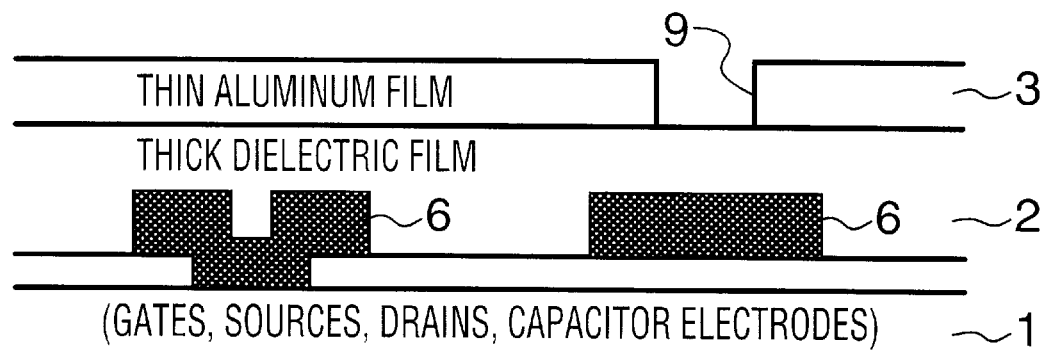

FIGS. 2b, 3b, 4b shown the formation of via holes a, which are etched down to the first level interconnect patterns 6.

The aluminum or aluminum alloy hard mask can be removed or left in place. The wafer is then ready for interconnect material deposition. The mask can also be made of TiN or a composite TiN/Al layer.

The use of aluminum or aluminum alloy mask approach over dielectric layers has many advantages. The photoresist is much easier to remove over aluminum, after aluminum etch, than over dielectric, after dry dielectric etch. The removal of such photoresist does not require special equipment and can be done with solvents.

Since most dielectrics are etched in fluorine-based dry chemistries, and since aluminum fluorides are not volatile, the aluminum hard mask has very low etch rate, selectivity of dielecric-to-hard mask should be very high, chamber contamination should be very low, and available etch time between scheduled maintenance should be improved.

Since the hard mask is much more difficult to erode than equivalent photoresist mask, etch related critical dimension losses are reduced and very long overetches are possible, when necessary.

If the hard mask is left in place, the interconnect material deposition can be done immediately after completion of the etch step, without interruption and without breaking vacuum. This permits complete integrated processing of dielectrics between photo steps in new equipment such as cluster tools, the dielectric etch module (which uses an aluminum alloy hard mask) can use a single cluster tool in order to, in-situ and automatically perform the dry etching of the aluminum alloy hard mask, perform the dry stripping of the temporary photoresist, perform the dry etching of contact holes and vias, do the deposition the interconnect material which is normally an aluminum alloy, possibly in combination, with a refractory metal or compound.

Since these four steps can be performed without interruption and without breaking vacuum, this approach constitutes a major improvement of the processing of devices. As an added side advantage, the manufacturing of devices for which the dielectric to be etched does include porous materials, such as spin-on glass, the non-exposure of the porous dielectric media to ambient air prevent moisture re-absorption and via-specific contact resistivity problems.

This first in-situ and non interrupted cluster tool based integrated processing etch module using hard mask approach constitutes very important improvement over the traditional multi-step, multi-equipment, and multi-operator etch module approach and should be seen as a very efficient way of manufacturing future semiconductor devices.

The same approach is true if the material to be patterned is an aluminum alloy. In this case, the hard mask left in place is a suitable dielectric, such as a thin oxide layer, a nitride layer, an oxynitride layer, or other common dielectrics used in typical semiconductor processes, and the insulating material deposition is done immediately after the completion of the etch step, without interruption and without breaking vacuum. This permits complete integrated processing of interconnects between photo steps in new equipment such as cluster tools: The interconnect etch module which uses an oxide or another dielectric hard mask can use a single cluster tool in order to, in-situ and automatically do the dry etching of the oxide hard mask, do the dry stripping of the temporary photoresist, perform the dry etching of the interconnect lines, do the deposition the insulating material which is normally a silicon oxide layer, doped or not with phosphorus, in combination or not with a silicon nitride or silicon oxinitride layer.

Since these four steps could be performed without interruption and without breaking vacuum, this approach constitutes a major improvement of the processing of devices. As an added side advantage, the manufacturing of devices for which the interconnects to be etched have a tendency to corrode in air, as is the case for advanced interconnect sandwiches that use combinations of aluminum alloys and titanium or tungsten based refractory metals or compounds, the non-exposure of the interconnects to ambient air prevents corrosion problems.

This second in-situ and non interrupted cluster tool based integrated processing etch module using a hard mask approach constitutes a very important improvement over the traditional multi-step, multi-equipment, and multi-operator etch module approach and is a very efficient way of manufacturing future semiconductor devices.

The use of both, first and second, integrated processing etch modules using hard masks, makes possible the almost complete automation of the back-end of semiconductor devices.

The replacement of a low speed of rotation spin (thick) layer of photoresist by a higher speed of rotation spin (thinner) layer (typically about 200 nm) improves its uniformity and critical dimensions.

The depth-of-focus does not need to be as large and, with the same numerical aperture equipment, better photo capability results, particularly on topography. The pattern transfer, from the mask to the resist and from the resist to the hard mask, is improved.

With the integrated processing approach, wafer manipulation is reduced after contact and via patterning and contamination reduction should result. Through-the-wall equipment can reduce clean room costs.

While the hard mask can be made of a different material than aluminum or aluminum alloy; it is nevertheless preferred to not remove the hard mask after contact or via hole patterning and prior to the deposition of the interconnect material in order to make the integrated processing possible.

The same concept can be applied to the interconnect etch module. In that case, a hard mask is deposited over the interconnect material to be patterned. If the hard mask is a thin dielectric layer which is suitable to further processing steps, integrated processing can also result.

The use of these two integrated processing sequences, one for dielectric patterning and one for interconnect, makes the processing between photo steps a fully integrated and automated sequence with reduced human interaction and contamination.

The cost effectiveness of such an approach looks more interesting as the cost of cleanrooms increases.

This invention describes a way of a hard mask in order to obtain a more reliable dielectric etch module with improved characteristics for large dies (large surface coverage ratio) applications.

We claim:

1. A method of fabricating a semiconductor device which includes etching holes through at least one deposited dielectric layer to an underlying structure, comprising the steps of depositing on said at least one deposited dielectric layer a hard mask which is inert to chemicals used to etch said at least one deposited dielectric layer, patterning said hard mask with photoresist, etching holes in said patterned hard mask, removing said photoresist, and subsequently etching holes in said at least one deposited dielectric layer through the holes in said hard mask.

2. A method as claimed in claim 1, wherein said hard mask is made of a material selected from the group consisting of: aluminum or an aluminum-alloy, TiN or a combination of Al and TiN.

3. A method as claimed in claim 2, wherein said hard mask is an alloy of aluminum, silicon and copper.

4. A method as claimed in claim 3, wherein said hard mask has the following composition: Al-1.0wt % Si-0.5wt % Cu.

5. A method as claimed in claim 1, wherein said hard mask is a thin film about 200 nm. thick.

6. A method of fabricating a semiconductor device which includes etching holes through at least one deposited layer to an underlying structure, comprising the steps of depositing on said at least one deposited layer a hard mask which is inert to chemicals used to etch said at least one deposited layer, patterning said hard mask with photoresist, etching holes in said patterned hard mask, removing said photoresist, and subsequently etching holes in said at least one deposited layer through the holes in said hard mask, wherein the etching of the hard mask, the stripping of the photoresist, and the etching of the holes in said at least on deposited layer are carried out in an uninterrupted vacuum.

7. A method as claimed in claim 1, wherein the hard mask is left in situ and an additional layer is deposited on said hard mask without breaking the vacuum.

8. A method of fabricating a semiconductor wafer, comprising the steps of:
   a) depositing a mask of hard material, which is inert to etch chemicals used in step f, over an underlying layer to pattern;
   b) depositing a photoresist layer over said mask;
   c) baking the photoresist;
   d) locally exposing the photoresist to form a desired pattern of regions on said mask;
   e) locally removing said regions of the photoresist;
   d) etching away the hard material in said regions;
   e) removing said photoresist layer; and
   f) subsequently etching holes in the underlying layer through said openings in said mask.

9. A method as claimed in claim 8, wherein said underlying layer is a dielectric and said hard inert material is selected from the group consisting of: aluminum, aluminum-alloy, TiN, and a combination of Al and TiN.

10. A method as claimed in claim 8, wherein said underlying layer is a conductive layer and said hard material is a dielectric.

11. A method as claimed in claim 10, wherein said mask is left in situ during a subsequent deposition step.

12. A method as claimed in claim 10, wherein said hard material is selected from the group consisting of: silicon oxide, silicon nitride, or silicon oxynitride.

13. A method as claimed in claim 8, wherein the after deposition of the photoresist layer, the wafer is transferred to a photoresist stripper for removal of the photoresist, and then subsequently transferred to a dry-etcher to form holes in the at least one deposited layer.

14. A method as claimed in claim 8, wherein the photoresist is applied to said mask layer as a high speed thin layer.

* * * * *